US011685987B2

(12) United States Patent
Manasterski et al.

(10) Patent No.: US 11,685,987 B2
(45) Date of Patent: Jun. 27, 2023

(54) METHOD FOR MANUFACTURING A DECORATIVE SURFACE

(71) Applicant: The Swatch Group Research and Development Ltd, Marin (CH)

(72) Inventors: Christian Manasterski, Colombier (CH); Marion Gstalter, Dombresson (CH)

(73) Assignee: The Swatch Group Research and Develonment Ltd, Marin (CH)

( * ) Notice: Subject to any disclaimer, the term of this patent is extended or adjusted under 35 U.S.C. 154(b) by 200 days.

(21) Appl. No.: 17/081,375

(22) Filed: Oct. 27, 2020

(65) Prior Publication Data
US 2021/0172048 A1 Jun. 10, 2021

(30) Foreign Application Priority Data

Dec. 9, 2019 (EP) ..................................... 19214570

(51) Int. Cl.
| | |
|---|---|
| *C23C 14/06* | (2006.01) |
| *C23C 14/02* | (2006.01) |
| *C23C 14/34* | (2006.01) |
| *C23C 14/58* | (2006.01) |

(52) U.S. Cl.
CPC .......... *C23C 14/067* (2013.01); *C23C 14/021* (2013.01); *C23C 14/34* (2013.01); *C23C 14/5813* (2013.01)

(58) Field of Classification Search
CPC ..... C23C 14/067; C23C 14/021; C23C 14/34; C23C 14/5813; C23C 14/0015; C23C 14/3414; C23C 14/022; C23C 14/505; C23C 14/5873; A44C 27/006; B23K 26/0622; B23K 26/355; B44C 1/005; G04B 19/042; G04B 19/12; G04B 37/223; G04D 3/0074; G04D 3/0092; G04D 3/0097

See application file for complete search history.

(56) References Cited

U.S. PATENT DOCUMENTS

| | | | | |
|---|---|---|---|---|
| 3,958,070 A * | 5/1976 | Schintlmeister | ........ | C23C 16/34 428/209 |
| 5,176,890 A | 1/1993 | Iltis et al. | | |
| 2009/0045051 A1 * | 2/2009 | Ferrasse | .............. | H01J 37/3426 204/298.12 |
| 2009/0209420 A1 * | 8/2009 | Kalgutkar | ................. | B32B 5/16 503/201 |
| 2010/0133092 A1 * | 6/2010 | Mashimo | ............ | H01L 21/3144 204/192.21 |
| 2011/0259733 A1 * | 10/2011 | Watanabe | ........... | H01J 37/3408 204/192.12 |
| 2013/0017137 A1 * | 1/2013 | Takahashi | ............. | C23C 14/067 423/289 |
| 2013/0171373 A1 * | 7/2013 | Comacho-Lopez | .... | C23C 14/18 427/554 |
| 2015/0122774 A1 * | 5/2015 | Fernandez Ciurleo | ...................... | C04B 41/52 63/35 |

FOREIGN PATENT DOCUMENTS

| | | |
|---|---|---|
| CH | 714 234 A1 | 4/2019 |
| CH | 714234 A1 * | 4/2019 ........... B23K 26/352 |
| CN | 101045645 A | 10/2007 |
| KR | 10-0964574 B1 | 6/2010 |

OTHER PUBLICATIONS

CH-714234-A1 Translation (Year: 2019).*
Mitterer, et al., Structure and properties of decorative rare-earth hexaboride coatings, 1996, Surface and Coatings Technology, 86-87, 715-721 (Year: 1996).*
C. Mitterer et al., "Structure and properties of decorative rare-earth hexaboride coatings", Surface and Coatings Technology, Dec. 1996, pp. 715-721, vol. 86-87, Elsevier.
European Search Report of EP 19 21 4570 dated Jun. 10, 2020.
C. Mitterer, "Decorative boride coatings based on LaB$_6$", Surface and Coatings Technology, 1995, vol. 74-75, pp. 1020-1027 (8 pages total).

* cited by examiner

*Primary Examiner* — Jennifer Wecker
*Assistant Examiner* — Patrick S Ott
(74) *Attorney, Agent, or Firm* — Sughrue Mion, PLLC

(57) ABSTRACT

A layer of lanthanum boride of stoichiometry LaB$_x$ where x is between 9 and 12 is deposited on substrate, for example a stainless steel watch dial, and subsequently treated with a laser, such that the portion(s) of the layer treated with the laser change colour according to the laser power. This produces multicoloured surfaces having high resistance to corrosion and abrasion. The layer of LaB$_x$ is deposited by PVD and by cathode sputtering, using a LaB$_6$ target of purple-violet colour, such that the colour of the deposited layer differs from the colour of the target. The laser treatment at specific powers changes the stoichiometry of the layer in the treatment portions, such that the colour of these portions changes according to the stoichiometry obtained. At higher powers, the laser will remove the layer of LaB$_x$. Thus the colour of the treated portions is determined by the material of the substrate.

8 Claims, No Drawings

METHOD FOR MANUFACTURING A DECORATIVE SURFACE

CROSS-REFERENCE TO RELATED APPLICATION(S)

This application claims the benefit based on Patent Application No. EP19214570.4 filed Dec. 9, 2019, the contents of all of which are incorporated herein by reference in their entirety.

TECHNICAL FIELD

The invention relates to the field of the manufacture of decorative surfaces for luxury items, such as watches or jewelry. The invention relates more particularly to the use of lanthanum hexaboride ($LaB_6$) for producing these decorative surfaces.

TECHNOLOGICAL BACKGROUND

Lanthanum hexaboride belongs to the rare earths. In view of the very low work function thereof, i.e. about 2.4 eV, this material is routinely used in the field of electronics. One of the main uses is the manufacture of hot cathodes.

The stoichiometry $LaB_6$ has an intense purple-violet colour, and the adjacent stoichiometries can take on blue or green colours for example. This ceramic has a very high hardness value (about 2500 HV), and a high corrosion resistance.

SUMMARY OF THE INVENTION

According to the present invention, a layer of lanthanum boride of stoichiometry $LaB_x$ is deposited on a substrate, for example a stainless steel watch dial, and subsequently treated with a laser, so as to modify said stoichiometry of said portion of the layer of $LaB_x$ subjected to the laser treatment to $LaB_y$ and give same a colour, said colour obtained being determined by the laser parameters. The change from $LaB_x$ to $LaB_y$ occurs by adjusting the laser parameters. The laser parameters are particularly the impulse duration, the mean laser beam power, the energy per impulse, the repeat frequency, the spot diameter, the spot overlap in the longitudinal and transversal direction and the fluence per impulse.

Advantageously, the $LaB_x$ layer is converted by the laser treatment into $LaB_y$ where y is between 9 and 12.

This method makes it possible to produce multicoloured surfaces having a high resistance to corrosion and abrasion. Preferably, the layer of $LaB_x$ is deposited by PVD (Physical Vapour Deposition), and preferentially by cathode sputtering, using a $LaB_6$ target of purple-violet colour, such that the colour of the deposited layer differs from the colour of the target. The laser treatment at specific powers changes the stoichiometry of the layer in the treatment portions, such that the colour of these portions changes according to the stoichiometry obtained. At higher powers, the laser will essentially remove the layer of $LaB_x$, such that the colour of the treated portions is determined by the material of the substrate.

The invention also relates to a decorative object produced using the method of the invention, particularly an object including a substrate provided with a layer, the layer comprising at least two portions of different colours with respect to one another, the portions consisting at least on the surface thereof of lanthanum boride determined by different lanthanum boride stoichiometries in the different portions. Preferably, one of the portions of the surface of said layer comprises a $LaB_y$ where y is between 9 and 12.

DETAILED DESCRIPTION OF THE INVENTION

A detailed embodiment of the invention will be described hereinafter. This embodiment does not limit the scope of the invention, but merely serves as an example of use of the method according to the invention.

The target is prepared by depositing $LaB_6$ in the form of a purple-violet coloured powder on a sole, preferably made of copper. The powder is sintered and brazed on the sole, such that a solid layer, once again of purple-violet colour, is formed on the sole, which can serve as a target for the application of a PVD deposition by cathode sputtering. Typically, the thickness of the solid layer is of the order of 500 nm (0.5 µm). Soles provided with $LaB_6$ and prepared in advance are available for PVD applications. In the example of the method described hereinafter, the inventors used a sole provided with a circular layer of $LaB_6$ having a diameter of about 75 mm.

A stainless steel substrate of 20 mm×30 mm is introduced into an RF-CCP (Radio-Frequency Capacitively Coupled Plasma) type reactor, and is placed on a platform inside the reactor chamber. The reactor includes a support suitable for holding the target and a standard RF source. The reactor is provided with means for reducing and regulating the pressure inside the chamber, and means for introducing a flow of a gaseous fluid, such as argon, into the chamber.

In the current example, the reactor is operated in confocal mode. This implies that the target is placed at an angle preferably of 30° with respect to the central axis and perpendicular to the platform. The platform is rotatably mounted and can rotate about this central axis.

A step of cleaning the substrate is first performed, by subjecting it to an etching process, by means for example of an argon plasma created in the reactor chamber, after installing the target. The parameters of this etching step are for example as follows: pressure $1.5 \cdot 10^{-2}$ mbar; duration 5 min; acceleration voltage 600 V.

Then, the target is used in the support so as to act as a cathode during the PVD deposition, and such that the distance between the target and the centre of the substrate is typically 110 mm. The deposition of a layer of lanthanum boride of about 500 mm in thickness by PVD in argon, via cathode sputtering of the target, occurs under the following typical conditions:

Power applied to the cathode: 250 W (i.e. 404 V for 0.62 A in DC mode)
Ar pressure: 3 µbar.
Deposition temperature: 430° C. (this temperature is a setpoint programmed on the machine, and not the actual temperature measured on the substrate).
Bias applied to the cathode with respect to the substrate: −150V DC
Deposition time: 1500 seconds to obtain 300 nm (0.2 to 0.25 nm/s).
Rotational speed of substrate: about 10 rpm It is observed that the colour of the deposited layer differs from the purple-violet colour of the target. The colour of the deposited layer is slate grey-blue. The explanation of this difference in colouring is provided by the SEM-EDX analysis of the layer. A layer of stoichiometry $LaB_6$ is no longer the target, but a stoichiometry $LaB_9$ to $LaB_{12}$, hereinafter referred to as $LaB_x$. Indeed, the sputtering rates of lanthanum and boron are different, which results in a boron-enriched and therefore lanthanum-depleted layer.

According to the invention, the local laser treatment of the layer deposited by PVD will once again change the colour of the layer. A marking laser is used operating in the infrared range. The laser is controlled to sweep a spot over a predefined portion of the surface of the layer of $LaB_x$. According to the parameters applied, three different colours can be obtained on adjacent zones of the same substrate: blue, violet and grey-white, so as to obtain a multicoloured pattern on the substrate. The following table discloses the typical parameters applied in the three cases.

| Colours obtained ⇨ Parameters applied ⇩ | blue | Violet | Grey-white |
|---|---|---|---|
| Impulse duration | 4 ns | 8 ns | 4 ns |
| Mean power | 8 t0 10 W | 5.2 W | 18 to 20 W |
| Energy per impulse | 40 to 100 µJ | 11.6 µJ | 90 to 135 µJ |
| Repeat frequency | 100 to 200 kHz | 400 to 500 kHz preferably 450 kHz | 150 to 200 kHz |
| Spot diameter | 68 µm | 68 µm | 68 µm |
| Spot overlap in longitudinal and transversal direction | 70 & 85% | 97 & 98% | 80 & 85% |
| Fluence per impulse | 1.2 to 2.8 J/cm2 | 0.30 to 0.34 J/cm2 preferably 0.32 J/cm2 | 2.5 to 3.7 J/cm2 |

It was observed that the laser power primarily defined the colour obtained. The differences in terms of frequency, overlap and impulse duration have little or no impact on the colour, but can result in different shades of the same colour.

An SEM-EDX analysis established that the blue and violet layers consist of specific stoichiometries of lanthanum boride which determine the colours in question. On the other hand, the grey-white colour contains little boron and lanthanum, but the colour thereof is determined by the presence of Fe and Ni of the stainless steel substrate. This means that the layer of LaBy has essentially been removed or partially removed and that the colour is determined primarily by the colour of the substrate.

A series of nano-indentations demonstrated that the layer deposited by PVD had a hardness value of about 2500 HV, and that after laser treatment it retained a hardness value of 1500 HV for violet and 1000 HV for blue, which is sufficient for horological applications exposed to abrasion. Furthermore, a "tropical climate" test, i.e. exposure in an chamber to a temperature of 60° C., with a % RH of 90% for 7 days, demonstrated that the coating was in no way affected.

Thus, in a non-limiting manner and once the laser spot does not pass through the layer of $LaB_x$, it is possible to decorate, according to this method, a horological component such as a horological dial, hands, a watch case, a clasp element, or a bracelet link.

Obviously, the present invention is not limited to the example illustrated but is suitable for various variants and modifications which will be obvious to those skilled in the art. In particular, the invention would not be limited to an external horological part or even to the horological field. Thus, by way of example, there is nothing to prevent using the method according to the invention for an application in the field of tableware, jewelry, leather goods, or indeed writing implements.

The invention claimed is:

1. A method for manufacturing a decorative surface on a substrate, wherein the method comprises the following steps:
    depositing a layer of $LaB_x$ on the substrate having a first stoichiometry, wherein x is between 9 and 12; and
    subjecting at least a portion of the layer of $LaB_x$ to a laser treatment with a laser source, so as to modify said stoichiometry $LaB_x$ of said portion of the layer of $LaB_x$ subjected to the laser treatment to $LaB_y$, and give said portion of the layer a colour, said colour obtained being determined by a type of the laser source, as well as laser parameters of the laser source.

2. The method according to claim 1, wherein the layer is deposited by physical vapour deposition (PVD).

3. The method according to claim 2, wherein the layer is deposited by cathode sputtering of a target comprising $LaB_6$ in the form of a powder sintered and brazed on a sole.

4. The method according to claim 3, wherein the PVD is performed in a radio-frequency capacitively coupled plasma (RF-CCP) type reactor.

5. The method according to claim 1, wherein the $LaB_x$ layer is converted by the laser treatment into $LaB_y$, where y is between 9 and 12 and is different from x.

6. The method according to claim 1, further comprising a step of etching the substrate, before depositing the layer of $LaB_x$.

7. The method according to claim 1, wherein several adjacent portions of the layer are treated with the laser at different powers, so as to obtain a multicoloured pattern on the substrate.

8. The method according to claim 1, wherein the laser treatment uses a marking laser, operating in the infrared range, and by sweeping a laser spot over at least a portion of the surface of the deposited layer.

* * * * *